United States Patent
Hsiang

(10) Patent No.: US 7,424,633 B2
(45) Date of Patent: Sep. 9, 2008

(54) METHOD FOR ESTIMATING POWER CONSUMPTION OF A CPU

(75) Inventor: Sung-Jen Hsiang, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 305 days.

(21) Appl. No.: 11/308,996

(22) Filed: Jun. 6, 2006

(65) Prior Publication Data

US 2006/0294408 A1    Dec. 28, 2006

(30) Foreign Application Priority Data

Jun. 24, 2005    (CN)    .................... 2005 1 0035553

(51) Int. Cl.
*G06F 1/26* (2006.01)

(52) U.S. Cl. ...................... 713/340; 713/300

(58) Field of Classification Search .......... 713/300–340
See application file for complete search history.

(56) References Cited

U.S. PATENT DOCUMENTS

| | | | | |
|---|---|---|---|---|
| 6,002,878 | A | * | 12/1999 | Gehman et al. ............. 713/340 |
| 6,330,703 | B1 | * | 12/2001 | Saito et al. ...................... 716/4 |
| 6,845,456 | B1 | | 1/2005 | Menezes et al. |
| 2002/0084798 | A1 | * | 7/2002 | Osburn et al. ................ 324/765 |

\* cited by examiner

*Primary Examiner*—Dennis M Butler
(74) *Attorney, Agent, or Firm*—Winston Hsu

(57) ABSTRACT

This invention provides a method for testing the power consumption of a CPU. This method involves recording energy output data from a controllable energy input through a CPU emulator. These data is used for assessing the power transferring efficiency. The CPU emulator is then replaced with a CPU, and then a program is run such that the CPU will maximize energy consumption. The energy consumption data is recorded and analyzed with regards to the power transferring efficiency estimating the power consumption of the CPU.

11 Claims, 6 Drawing Sheets

| No | Input voltage ($V_{in1}$ : volt) | Input current ($C_{in1}$ : ampere) | Core voltage ($V_{core1}$ : volt) | Output current ($C_{out1}$ : ampere) | CPU fixture power transferring efficiency ($PWE_1$ : %) |
|----|------|--------|-------|-----|-------|
| 1  | 12.08 | 0      | 1.425 | 0   | 0     |
| 2  | 12.07 | 1.798  | 1.404 | 10  | 64.69 |
| 3  | 12.01 | 2.998  | 1.383 | 20  | 76.82 |
| 4  | 11.95 | 4.258  | 1.365 | 30  | 80.48 |
| 5  | 11.89 | 5.508  | 1.347 | 40  | 82.27 |
| 6  | 11.82 | 6.808  | 1.328 | 50  | 82.51 |
| 7  | 11.76 | 8.058  | 1.307 | 60  | 82.75 |
| 8  | 11.69 | 9.458  | 1.285 | 70  | 81.36 |
| 9  | 11.63 | 10.758 | 1.26  | 80  | 80.57 |
| 10 | 11.57 | 12.058 | 1.238 | 90  | 79.86 |
| 11 | 11.51 | 13.558 | 1.213 | 100 | 77.73 |
| 12 | 11.45 | 14.858 | 1.184 | 110 | 76.56 |

FIG. 4

| Input voltage ($V_{in2}$ : volt) | Input current ($C_{in2}$ : ampere) | Core voltage ($V_{core2}$ : volt) |
|---|---|---|
| 11.73 | 9 | 1.4 |

FIG. 5

| | | |
|---|---|---|
| $Y_1$ | CPU fixture power transferring efficiency (PWE$_1$: %) | 82.75 |
| $X_1$ | Input current (C$_{in1}$: ampere) | 8.058 |
| $Y_3$ | CPU fixture power transferring efficiency (PWE$_1$: %) | 81.36 |
| $X_3$ | Input current (C$_{in1}$: ampere) | 9.458 |
| $X_2 = C_{in2}$ | Input current (C$_{in2}$: ampere) | 9 |
| $PWE_2 = Y_2 = Y_1 + \dfrac{(X_2 - X_1)(Y_3 - Y_1)}{(X_3 - X_1)}$ | CPU power transferring efficiency (PWE$_2$: %) | 81.81 |
| $P = PWE * V_{in2} * C_{in2}$ | Power consumption of the CPU (P: watt) | 86.37 |
| $C_{in} = P / V_{core2}$ | Current consumption of the CPU (C$_{in}$: ampere) | 61.69 |

FIG 6

METHOD FOR ESTIMATING POWER CONSUMPTION OF A CPU

FIELD OF THE INVENTION

The present invention relates to methods for estimating power consumption of a CPU, and more particularly to a method for estimating power consumption of a CPU by emulation.

DESCRIPTION OF RELATED ART

In recent years, with the performance of computer technology continually improving, electronic equipments, especially personal computers (PCs) have become more miniature and portable. Improving the processing speed of a central processing unit (CPU) and decreasing power consumption is an important continuing pursue. To decrease power consumption of the CPU, it is especially important to estimate the power consumption of the CPU accurately and quickly. As a result, more combination components is required by applying traditional power testing methods on power consumption such as resistances and inductances, including the many other important data that needs to be tested. The power consumption of the CPU is calculated according to test data and several formulas. The whole process of testing is very tedious, especially when a test person is required to test power consumptions on a significant number of CPUs. The power consumption test of each CPU is independent, and the CPU needs to be constantly replaced to test corresponding data again and again, such as currents, voltages and resistances.

Furthermore, the Intel provided Land Grid Array (LGA) 775 surface makes the cover areas of heat sinks more larger, making it difficult to estimate the power consumption of the CPU by utilizing the traditional methods.

What is needed, therefore, is a method that can estimate the power consumption of the CPU more accurately and quickly. The method utilizes an emulation technology to help the test person estimate the power consumptions of various CPUs in a short time.

SUMMARY OF INVENTION

One preferred embodiment provides a method for estimating power consumption of a CPU. The method includes the steps of: switching on a power supply, which provides power to a motherboard through a connector; creating a power estimation table; installing a CPU fixture on the motherboard, the CPU fixture being connected with a direct current electronic load; adjusting output current data of the direct current electronic load and recording test data of input voltage data and input current data of the connector, and output voltage data of the CPU fixture according to different adjusted output current data; calculating multiple CPU fixture power transferring efficiency; replacing the CPU fixture with a CPU on the motherboard and disconnecting the direct current electronic load; executing a test program and recording test data of an input voltage data and an input current data of the connector, and a core voltage data of the CPU; analyzing and calculating a CPU power transferring efficiency according to the above recorded test data; and estimating the power consumption of the CPU as product of the CPU power transferring efficiency, the input voltage data and the input current data that were recorded in the executing step.

Another preferred embodiment provides a method for estimating power consumption of a CPU, the method comprising the steps of: switching on a power supply, which provides power to a motherboard through a connector; creating a power estimation table; installing a CPU fixture on the motherboard, the CPU fixture being connected with a direct current electronic load; adjusting output current data of the direct current electronic load and recording test data of input voltage data and input current data of the connector, and output voltage data of the CPU fixture according to different adjusted output current data; calculating multiple CPU fixture power transferring efficiency; replacing the CPU fixture with a CPU on the motherboard and disconnecting the direct current electronic load.

Other advantages and novel features of the present invention will become more apparent from the following detailed description of preferred embodiments when taken in conjunction with the accompanying drawings.

BRIEF DESCRIPTION OF DRAWINGS

FIG. 4 is a data flow diagram of the test data for implementing the method of FIG. 3 with the hardware configuration shown in FIG. 1;

FIG. 5 is a data flow diagram of the test data for implementing the method of FIG. 3 with the hardware configuration shown in FIG. 2; and FIG. 6 is a data flow diagram of estimation power of the CPU in FIG. 2.

DETAILED DESCRIPTION

Figure 1:
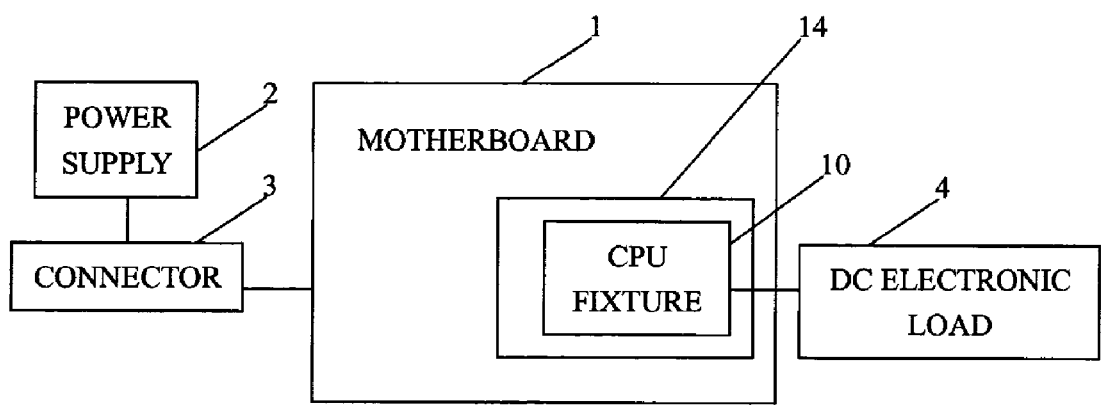
FIG. 1 is a schematic diagram of hardware configuration of a motherboard with a CPU fixture in accordance with a preferred embodiment.

FIG. 1 is a schematic diagram of hardware configuration of a motherboard with a CPU fixture in accordance with a preferred embodiment. The motherboard 1 connects a power supply 2 via a connector 3. The power supply 2 provides power with a 12-volt voltage for the motherboard 1. The CPU fixture 10 is installed on a CPU socket 14 of the motherboard 1 and used for emulating a CPU. The CPU fixture 10 connects with a DC (Direct Current) electronic load 4. The DC electronic load 4 is used for testing some parameters, such as the stability of the power supply 2, the load stability, output voltage, output current, and other instantaneous variables etc. Test persons test and record an input voltage data $V_{in1}$, an input current data $C_{in1}$ of the connector 3, and an output voltage data $V_{core1}$ of the CPU fixture 10 by adjusting output current data $C_{out1}$ of the DC electronic load and other test instruments, such as an ammeter or a voltage meter etc. An adjusting range of the output current data $C_{out1}$, of the DC electronic load 4 is from 0 ampere to 110 amperes. Various illustrational test data are shown in FIG. 4.

Figure 2:
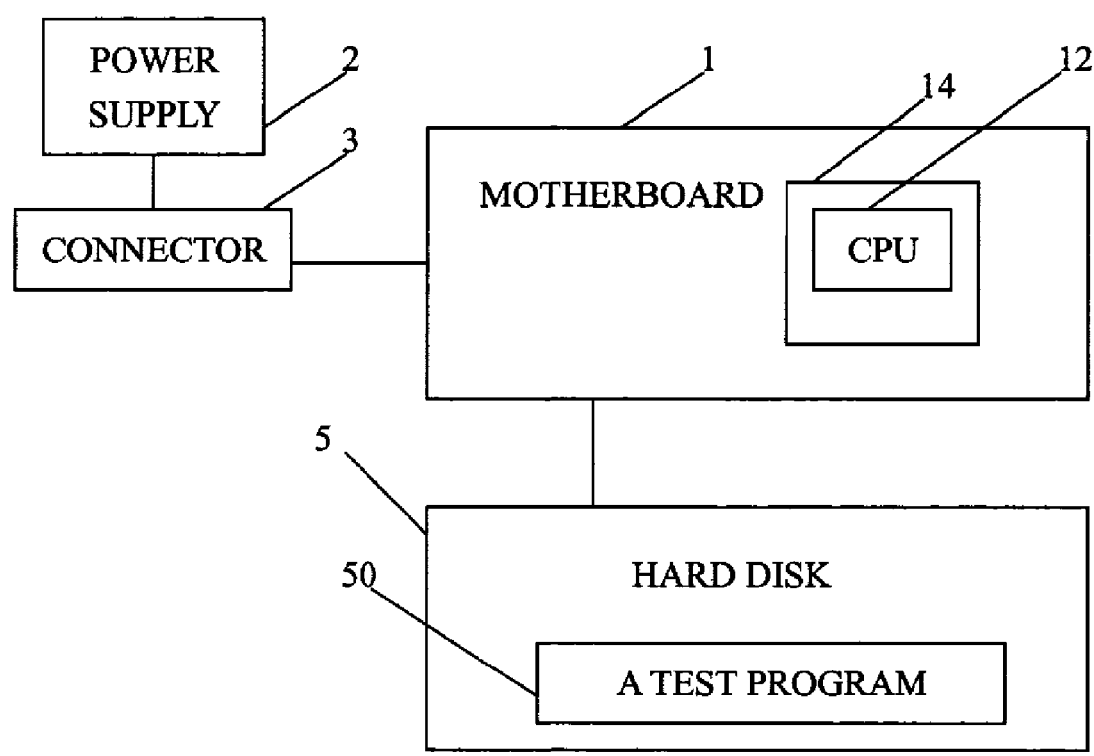
FIG. 2 is a schematic diagram of hardware configuration of the motherboard with a CPU in accordance with a preferred embodiment.

FIG. 2 is a schematic diagram of hardware configuration of the motherboard 1 with a CPU 12. The CPU 12 replaces the CPU fixture 10 on the CPU socket 14 of the motherboard 1. The motherboard 1 connects with a hard disk 5 that stores a test program 50. The test program 50 is required to be executed so as to maximize power consumption of the CPU. For example, a MaxPower program is generally used as the test program 50. In the emulation mode, any unstable element is expressed in a short time by rebooting an operating system. While the test program 50 is executing, an input voltage data $V_{in2}$, an input current data $C_{in2}$ of the connector 3, and a core voltage data $V_{core2}$ of the CPU 12 need to be tested and recorded. Illustrational test data are shown in FIG. 5.

Figure 3:
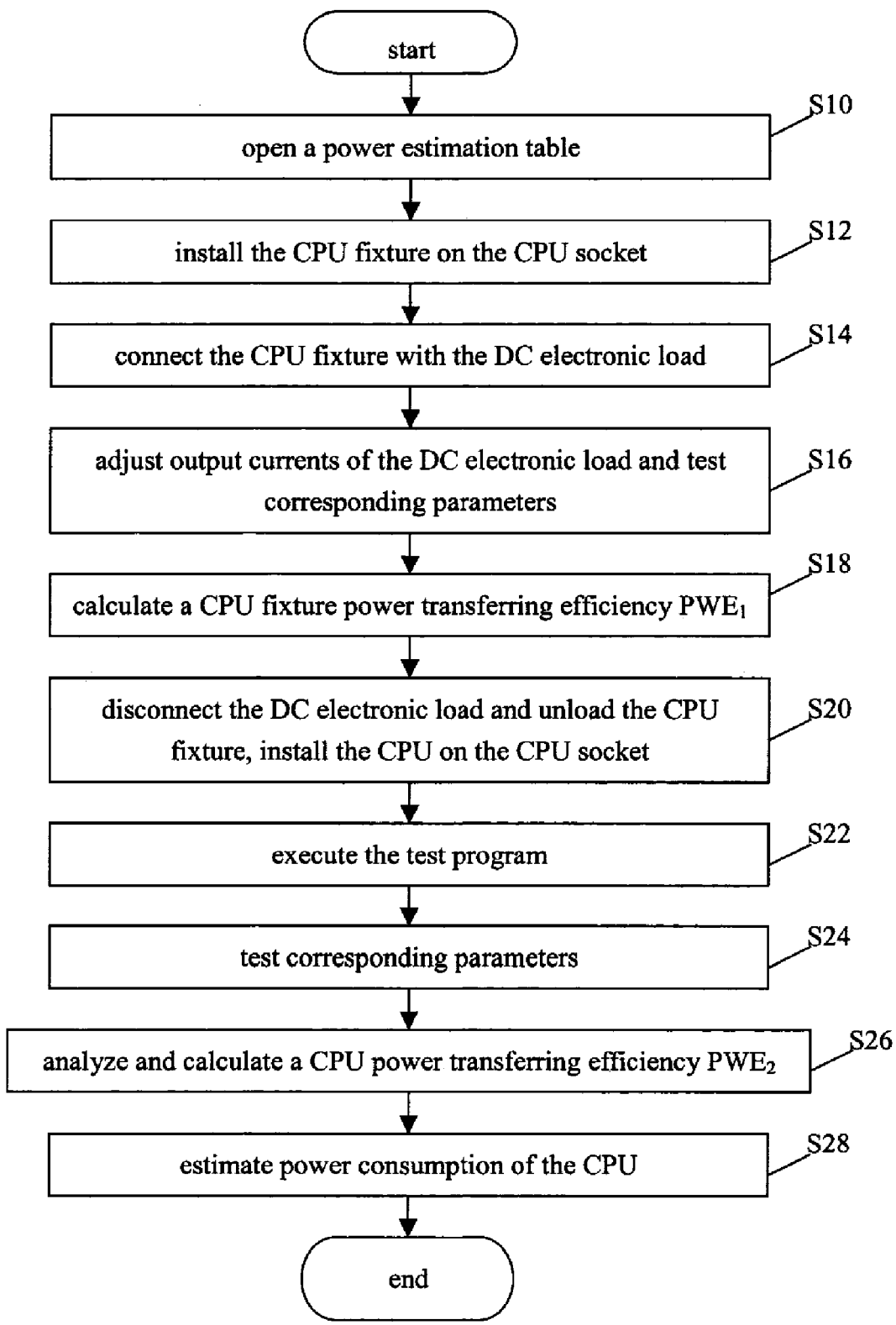
FIG. 3 is a flowchart of a method for estimating power consumption of a CPU.

FIG. 3 is a flowchart of a method for estimating power consumption of a CPU. In step S10, a test person creates a power estimation table after switching on the power supply 2. The power supply 2 provides power to the motherboard 1 through the connector 3. The power estimation table may be implemented with a Microsoft Excel spreadsheet with automated formula inserted in the power estimation table cells. The power estimation table includes several parts as shown in FIG. 4, FIG. 5, and FIG. 6, such that each part has at least one or more formula. After the test person fills corresponding test data into the power estimation table, the power estimation table calculates some parameters automatically according to the formula and the test data.

For example, the power estimation table includes a linear interpolation formula (shown in FIG. 6). The linear interpolation formula calculates a linear function that passes through two known coordinate points. The coordinates of the two known points are expresses as $(X_1, Y_1)$, $(X_3, Y_3)$, an inserted point is expressed as $(X_2, Y_2)$, where, $X_2$ of the inserted point is known, $Y_2$ is the linear function, such that $X_1 < X_2 < X_3$. The linear interpolation formula is expressed in the formula below:

$$Y_2 = Y_1 + \frac{(X_2 - X_1)(Y_3 - Y_1)}{(X_3 - X_1)}$$

The test person assigns the variables $X_1, Y_1, X_2, Y_3$, and $X_3$ in the power estimation table, and a value of $Y_2$ is then calculated automatically.

In step S12, the test person installs the CPU fixture 10 on the CPU socket 14 of the motherboard 1. In step S14, the CPU fixture 10 is connected with the DC electronic load 4.

In step S16, while adjusting output current data $C_{out1}$ of the DC electronic load, various corresponding parameters are recorded, such as the input voltage data $V_{in1}$, the input current data $C_{in1}$ of the connector 3, and the output voltage data $V_{core1}$ of the CPU fixture 10 according to different output current data $C_{out1}$ of the DC electronic load 4. The test data is then used to fill up the power estimation table as shown in FIG. 4.

In step S18, the power estimation table calculates a CPU fixture power transferring efficiency $PWE_1$ according to the above recorded test data and a formula: $PWE_1 = 100\% * (C_{out1} * V_{core1}) / (C_{in1} * V_{in1})$. The CPU fixture power transferring efficiency $PWE_1$ is a ratio of an output power over an input power. The output power of the CPU fixture 10 is the product of output current data $C_{out1}$ and output voltage data $V_{core1}$ of the CPU fixture 10, and the input power of the connector 3 is the product of input voltage data $V_{in1}$ and input current data $C_{in1}$ of the connector 3.

In step S20, the test person disconnects the DC electronic load 4 with the CPU fixture 10, and replaces the CPU fixture 10 with the CPU 12 on the CPU socket 14 of the motherboard 1. In step S22, the test program 50 stored in the hard disk 5 is executed. For example, a MaxPower program is generally used as the test program 50.

In step S24, an input voltage data $V_{in2}$, an input current data $C_{in2}$ of the connector 3 and a core voltage data $V_{core2}$ of the CPU 12 are recorded while the test program 50 is executing. The test data is used to fill in the power estimation table as shown in FIG. 5.

In step S26, by analyzing the test data, the power estimation table calculates the CPU power transferring efficiency $PWE_2$. First, the test person compares the input current data $C_{in1}$ and $C_{in2}$ of the connector 3 that are respectively tested in step S16 and in step S24, and selects two input current data $C_{in1}$ from the input current data of the connector 3 that are recorded in step S16. The selected two recorded input current data are proximal to the input current data of the connector 3 that was recorded in step S24 (see columns 7 and 8 in FIG. 4). The test person further selects two data of the CPU fixture power transferring efficiency $PWE_1$ that corresponds to the two selected input current data. After filling in the above selected data and the input voltage data $V_{in2}$, the input current data $C_{in2}$ of the connector 3 and the core voltage data $V_{core2}$ of the CPU 12 that were tested in step S24 (shown in FIG. 6), the power estimation table calculates the CPU power transferring efficiency $PWE_2$ by using the linear interpolation formula.

For example, if the input current data $C_{in2}$ of the connector 3 to be recorded in the step S24 is 9 amperes, the selected two proximal input current data $C_{in1}$ are 8.058 amperes and 9.458 amperes respectively, and the two corresponding data of the CPU fixture power transferring efficiency $PWE_1$ are 82.75% and 81.36%; after filling in the these test data variables, the power estimation table calculates the CPU power transferring efficiency $PWE_2$ at 81.81%.

In step S28, the power estimation table calculates other parameters, such as a power consumption of the CPU P and a current consumption of the CPU $C_{in}$. For example, the power consumption of the CPU P and the current consumption of the CPU $C_{in}$ by using test data from the previous example are calculated as 86.37 watts and 61.69 amperes as shown in FIG. 6.

If another CPU 12 need to be estimated, the test person needs only to replace the CPU 12 and redo step S22 to obtain new test data without repeating steps S10 to S20.

FIG. 4 is a data flow diagram of the test data for implementing the method of FIG. 3 with the hardware configuration shown in FIG. 1. For example, when the output current data of the DC electronic load 4 is adjusted to 10 amperes, the test person tests the input voltage data $V_{in1}$ and the input current data $C_{in1}$ of the connector 3 to be 12.07 volts and 1.798 amperes respectively, and the output voltage data $V_{core1}$ of the CPU fixture is tested to be 1.404 volts. The power estimation table calculates the CPU power transferring efficiency $PWE_1$ as 64.69% according to the formula of $PWE_1 = 100\% * (C_{out1} * V_{core1}) / (C_{in1} * V_{in1})$ FIG. 5 is a data flow diagram of the test data for implementing the method of FIG. 3 with the hardware configuration shown in FIG. 2. For example, after installing the CPU 12 on the CPU socket 14 of the motherboard 1, while the test program 50 is executing, the input current data $C_{in2}$, input voltage data $V_{in2}$ of the connector 3 are recorded to be 9 amperes and 11.73 volts respectively, and the core voltage data $V_{core2}$ of the CPU 12 to be 1.4 volts.

FIG. 6 is a data flow diagram of estimation power of the CPU 12 in FIG. 2. The power estimation table calculates corresponding parameters according to the recorded test data previously mentioned, and the details are described in steps S26 and S28 of the FIG. 3.

All the above-mentioned test data are only reference data, the test person can obtain more accurate test data by reducing the adjusting range of the DC electronic load 4 in practice.

Although the present invention has been specifically described on the basis of a preferred embodiment and a preferred method, the invention is not to be construed as being limited thereto. Various changes or modifications may be made to said embodiment and method without departing from the scope and spirit of the invention.

What is claimed is:

1. A method for estimating power consumption of a CPU, the method comprising the steps of:
   switching on a power supply, which provides power to a motherboard through a connector;
   creating a power estimation table;
   installing a CPU fixture on the motherboard, the CPU fixture being connected with a direct current electronic load;
   adjusting output current data of the direct current electronic load and recording test data of input voltage data and input current data of the connector, and output voltage data of the CPU fixture according to different adjusted output current data;
   calculating multiple CPU fixture power transferring efficiency;
   replacing the CPU fixture with a CPU on the motherboard and disconnecting the direct current electronic load;
   executing a test program and recording test data of an input voltage data and an input current data of the connector, and a core voltage data of the CPU;
   analyzing and calculating a CPU power transferring efficiency according to the above recorded test data; and
   estimating the power consumption of the CPU as a product of the CPU power transferring efficiency, the input voltage data and the input current data that were recorded in the executing step.

2. The method according to claim 1, wherein the power estimation table comprises a linear interpolation formula.

3. The method according to claim 1, wherein an adjusting range of the output current data of the direct current electronic load is from 0 ampere to 110 amperes.

4. The method according to claim 1, wherein the test program is used for maximizing power consumption of the CPU.

5. The method according to claim 1, wherein the power transferring efficiency is a ratio of an output power of the CPU fixture over an input power of the connector according to the test data recorded in the adjusting step.

6. The method according to claim 1, wherein the analyzing and calculating step comprises the steps of:
   comparing the recorded input current data of the connector that were respectively tested in the adjusting step and the executing step;
   selecting two recorded input current data from the input current data of the connector tested in the adjusting step such that the selected input current data being proximal to the input current data of the connector tested in the executing step;
   selecting two CPU fixture power transferring efficiency corresponding to the two selected recorded input current data;
   filling the two selected input current data, the two CPU fixture power transferring efficiency, and the input current data of the connector recorded in the executing step into the power estimation table; and
   calculating the CPU power transferring efficiency.

7. The method according to claim 1, wherein the estimating step comprises the step of estimating a current consumption of the CPU according to the CPU power consumption be divided by the core voltage data of the CPU recorded in the executing step.

8. A method for estimating power consumption of a CPU, the method comprising the steps of:
   switching on a power supply, which provides power to a motherboard through a connector;
   creating a power estimation table;
   installing a CPU fixture on the motherboard, the CPU fixture being connected with a direct current electronic load;
   adjusting output current data of the direct current electronic load and recording test data of input voltage data and input current data of the connector, and output voltage data of the CPU fixture according to different adjusted output current data;
   calculating multiple CPU fixture power transferring efficiency; and
   replacing the CPU fixture with a CPU on the motherboard and disconnecting the direct current electronic load.

9. The method according to claim 8, further comprising the step of executing a test program and recording test data of an input voltage data and an input current data of the connector, and a core voltage data of the CPU.

10. The method according to claim 9, further comprising the step of analyzing and calculating a CPU power transferring efficiency according to the above recorded test data.

11. The method according to claim 10, further comprising the step of estimating the power consumption of the CPU as a product of the CPU power transferring efficiency, the input voltage data and the input current data that were recorded in the executing step.

* * * * *